United States Patent

Martheli et al.

(10) Patent No.: US 6,297,707 B1
(45) Date of Patent: Oct. 2, 2001

(54) MICROWAVE OSCILLATOR WITH DIELECTRIC RESONATOR

(75) Inventors: Michel Martheli, Menucourt; Alain Pinchon, Vaureal; Michel Beuzer, Juvisy sur Orge, all of (FR)

(73) Assignee: Alcatel, Paris (FR)

( * ) Notice: Subject to any disclaimer, the term of this patent is extended or adjusted under 35 U.S.C. 154(b) by 0 days.

(21) Appl. No.: 09/599,441

(22) Filed: Jun. 22, 2000

(30) Foreign Application Priority Data

Jul. 1, 1999 (FR) .................................................. 99 08458

(51) Int. Cl.7 ....................................................... H03B 5/18
(52) U.S. Cl. .............................. 331/96; 331/56; 331/100; 331/114; 331/117 D
(58) Field of Search ................................ 331/96, 99, 100, 331/107 DP, 107 SL, 117 D, 56, 114

(56) References Cited

U.S. PATENT DOCUMENTS 5,289,139 * 2/1994 Fiedziuszko et al. .................. 331/56
5,752,180 * 5/1998 Guo et al. ............................. 455/319

FOREIGN PATENT DOCUMENTS

| 0 247 749 A2 | 12/1987 | (EP) . |
| 0 250 301 A1 | 12/1987 | (EP) . |
| 2 533 777 | 3/1984 | (FR) . |
| 56 156002 A | 12/1981 | (JP) . |

OTHER PUBLICATIONS

Lee, K. W. et al.: "Push–Push, Frequency–Doubling, MMIC Oscillators" Proceedings of the Gallium Arsenide Integrated Circuit Symposium (GAAS IC), US, New York, IEEE, vol. SYMP. 9, 1987, pp. 227–230, XP000430893.

Lan, G. et al.: "Ultrastable Low–Noise GAAS FET Oscillator with Dielectric Resonator" RCA Review, US, RCA Corp. Princeton, vol. 47, No. 4, Dec. 1, 1986, pp. 472–486, XP000001951.

* cited by examiner

*Primary Examiner*—Siegfried H. Grimm
(74) *Attorney, Agent, or Firm*—Sughrue, Mion, Zinn, Macpeak & Seas, PLLC

(57) ABSTRACT

A microwave oscillator includes at least two active components and a dielectric resonator. The coupling between each active component and the dielectric resonator is of the transmission type and the inputs of neighboring active components are connected to a first point coupled to the resonator and likewise the outputs of the active components are connected to a second point coupled to the resonator. A push-push oscillator of the above kind is simple to produce and its operation is relatively insensitive to adjustments.

8 Claims, 1 Drawing Sheet

MICROWAVE OSCILLATOR WITH DIELECTRIC RESONATOR

BACKGROUND OF THE INVENTION

1. Field of the Invention

The invention relates to a microwave oscillator with dielectric resonator.

2. Description of the Prior Art

Microwave oscillators with a dielectric resonator are routinely used in the electronics art. They are basic components of many circuits, in particular in the field of television or telecommunications.

An oscillator of this kind has an active part with an amplifier or negative impedance and a passive part including the dielectric resonator.

The active part and the passive part can be coupled by reflection or by transmission.

FIG. 1 shows a prior art set-up using transmission.

In this set-up, the active component is an amplifier 10 and the dielectric resonator 12 is in series in a feedback loop connecting the output 11 of the amplifier 10 to its input 13.

The line 14 connected to the output 11 of the amplifier 10 is magnetically coupled to the resonator 12. Similarly, the input line 16 is magnetically coupled to the resonator 12. The coupling between the resonator 12 and each of the lines 14, 16 therefore increases as the current in the line increases. This is why a line 18 of length $\lambda/4$ is generally provided at the input to provide a short circuit and thereby maximize the current. $\lambda$ is the wavelength corresponding to the frequency of the oscillator.

An oscillator of the above kind must conventionally satisfy two conditions, namely, on the one hand, the condition that the gain of the amplifier 10 must be greater than the losses of the feedback circuit between the output 11 and the input 13 and, on the other hand, the condition that there must be zero phase shift (modulo $2\pi$) of the signals across the circuit. To satisfy the second condition, the points at which the conductors 14 and 16 are coupled to the resonator 12 are diametrically opposed relative to the disk-shaped resonator, for example. Under these conditions, the resonator introduces a phase shift of $\pi$ radians and the amplifier 10 and the associated lines introduce a complementary phase shift of $\pi$ radians.

This type of oscillator has the advantage of being highly reproducible: it therefore lends itself to mass production as it requires few adjustments. On the other hand, it is not always easy to design because two couplings have to be determined: the couplings between the resonator and the lines 14 and 16. Furthermore, as it is necessary to provide a line 18 whose length is a function of the wavelength in order to produce the short circuit, the bandwidth of the associated circuit is small.

FIG. 2 shows a reflection type dielectric resonator oscillator which has two active components 20 and 22 and a dielectric resonator 24.

Each active component is coupled to the resonator 24 by reflection. The resonator reflects a wave emitted by an active component back to the active component, which amplifies it. For oscillation to be obtained it is also necessary to satisfy two conditions: the gain of the active component must be greater than the losses and the reflected waves must be in phase with the emitted waves. The second condition is satisfied by adjusting the distance between the coupling plane of the resonator and the ports of the active components.

In the so-called "push-push" set-up shown in FIG. 2, the oscillations produced are in antiphase because the point 23 at which the active component 22 is coupled to the disk-shaped resonator 24 is diametrally opposite the point 21 at which the active component 20 is coupled to the resonator 24. These waves in antiphase are transferred to an output point 32 by a combiner with lines 28 and 30.

In a set-up of this kind the resonator 24 is between two microstrip lines $23_1$ and $23_2$. The function of the resonator is to enable oscillation and to maintain the signals of the two oscillators in antiphase. It has been found that the oscillations are not maintained in antiphase correctly, which degrades performance, if oscillation does not occur at exactly the resonant frequency of the resonator. In fact, the oscillator is intended to supply a frequency $2f_0$ which is twice the fundamental frequency $f_0$ by exploiting the fact that the output waves are in antiphase at the frequency $f_0$ but cannot be in phase at double the frequency. The combiner with lines 28 and 30 eliminates the waves which are in antiphase and adds the waves which are in phase. However, because the characteristics of the combiner necessarily depend on the frequency $f_0$, it is clear that the fundamental frequency will not be completely eliminated if oscillation occurs at a different frequency.

Note also that the resonator 24, having to be exactly symmetrical relative to the lines $23_1$ and $23_2$, is not easy to position, which is a particularly serious problem, especially in mass production. Furthermore, it requires manual adjustment, in particular of the impedance 34 connecting an electrode of the active component 20 or 22 to ground. However, the advantage of this set-up is its low phase noise.

The object of the invention is to provide a microwave oscillator which delivers a wave at the frequency $2f_0$ using a resonator which resonates at the frequency $f_0$, which is easy to manufacture and whose operating parameters are relatively insensitive to adjustments.

The oscillator according to the invention includes at least two active components and a dielectric resonator and the coupling between each active component and the dielectric resonator is of the transmission type, the set-up being such that the input and the output of each active component are in antiphase at the resonant frequency of the resonator and the inputs of neighboring active components are connected to a first point coupled to the resonator and likewise the outputs of the active components are connected to a second point coupled to the resonator, the coupling of the ports to the resonator being such that they are practically short circuited.

In other words, it is the simultaneous presence of the active components that enables oscillation and the oscillations of two neighboring oscillators are synchronized with a phase difference of 180°. Accordingly, compared to the "push-push" structure shown in FIG. 2, the resonator enables one or other of the basic oscillators to oscillate but is not required to maintain a phase difference of 180° between the signals from the two oscillators. In other words, in the oscillator according to the invention, the two basic oscillators are synchronized independently of the resonator.

This makes the oscillator less sensitive to the parameters of the resonator.

Because the resonator of the oscillator according to the invention does not have to provide the phase difference of 180° between the oscillations produced by each of the basic oscillators, it is not necessary for the resonator to be exactly symmetrical relative to the first and second ports, whereas in the "push-push" circuit oscillator shown in FIG. 2 the resonator 24 must be symmetrical relative to the lines $23_1$ and $23_2$. The invention therefore enables different decouplings between the resonator and, on the one hand, the first port and, on the other hand, the second port.

Note also that, to obtain the antiphase relationship between the waves supplied by each of the active components, it is not necessary to provide a combiner hose line lengths depend on λ, as is the case in the "push-push" set-up of FIG. 2. he associated circuit can therefore have a greater bandwidth than prior art set-ups like those shown in FIGS. 1 and 2.

Furthermore, note that, compared to an oscillator having a single active component and coupled to a dielectric resonator by transmission (FIG. 1), the short circuit is obtained without it being necessary to provide a line having a length of a quarter-wavelength.

Over and above this, compared to the "push-push" set-up, the fact that a combiner is not necessary simplifies designing the oscillator.

SUMMARY OF THE INVENTION

The invention provides a microwave oscillator including at least two active components and a dielectric resonator and wherein the coupling between each active component and the dielectric resonator is of the transmission type and inputs of neighboring active components are connected to a first point coupled to the resonator and likewise outputs of the active component are connected to a second point coupled to the resonator.

In one embodiment waves in the lines terminating at the first coupling point are in antiphase and likewise waves in the lines terminating at the second coupling point are in antiphase.

The active components can be practically identical, the length of the lines connecting the first coupling point to the inputs of the active components can be practically equal and the lengths of the lines connecting the second coupling point to the outputs of the active components can be substantially equal.

The oscillator preferably includes an even number of active components associated with a single resonator.

The active components each include an amplifier, for example.

In one embodiment the resonator is circular and the coupling points are at diametrally opposite positions relative to the resonator.

The dielectric resonator has a resonant frequency chosen so that the oscillator has a frequency in the band from 10 GHz to 15 GHz, for example.

The invention also provides a method of producing an oscillator as defined above starting from an active component and a resonator, in which method a line of length λ/4 is connected to the first and second coupling points to provide short circuits, the distance of the coupling points from the resonator is adjusted to minimize feedback whilst maintaining the oscillation obtained with the active component, the lines of length λ/4 are removed and at least one other active component is installed at the coupling point(s).

Other features and advantages of the invention will become apparent from the description of embodiments of the invention which is given with reference to the accompanying drawing.

DETAILED DESCRIPTION OF THE PREFERRED EMBODIMENTS

Figure 3:
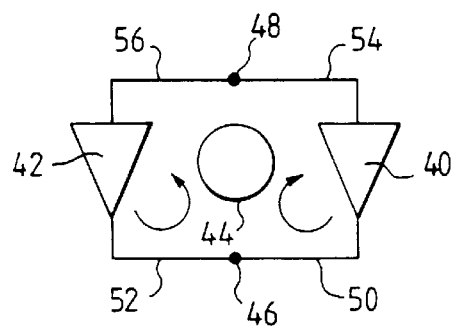
FIG. 3 is a block diagram of an oscillator according to the invention which has two active components.

The oscillator shown in FIG. 3 has two active components 40 and 42 and a dielectric resonator 44. In this embodiment the active components 40 and 42 are amplifiers. The dielectric resonator 44 is mounted in transmission in the feedback loop of each of the amplifiers 40 and 42 so that the coupling ports 46 and 48 practically constitute virtual grounds or short circuits. In this embodiment the resonator 44 is in the form of a disk and the ports 46 and 48 are at diametrally opposite positions relative to the disk.

Thus it can be seen that the output of the amplifier 40 is connected by a conductor 50 to the port 46. Similarly, a line 52 connects the output of the amplifier 42 to the port 46.

In an analogous manner, a line 54 connects the input of the amplifier 40 to the port 48 and a line 56 connects the input of the amplifier 42 to the port 48.

As already mentioned, to obtain a zero phase shift (module 2π) for a wave passing through an amplifier and the resonator 44 and returning to the input of the same amplifier, the amplifier and the associated lines must introduce a phase shift of π if the resonator introduces a phase shift of π. If the resonator introduces a phase shift other than π, the remainder of the circuit must introduce a phase shift that is its 2π's complement.

To obtain short circuits at the ports 46 and 48 the active components 40 and 42 are preferably identical and the lengths of the lines 50 and 52 are preferably equal. Likewise, the lengths of the lines 54 and 56 are also preferably equal. However, the antiphase relationship at the ports 46 and 48 between the oscillations of the two basic oscillators (and therefore the aforementioned short circuits) is obtained even if the components 40 and 42 are not identical and/or the lengths of the lines are not equal, because of the action of one basic oscillator on the other one.

One of the oscillators shown in FIG. 3 can be designed in the following manner:

The design process starts with an active component, for example the active component 40, of the resonator 44, the port 46 and the line 50 and the port 48 and the line 54. The active component 42 and the lines 52 and 56 are initially not provided.

Figure 1:
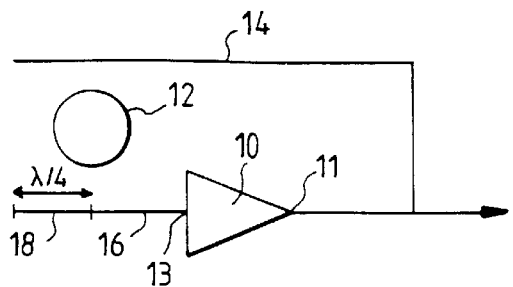
FIGS. 1 and 2, already described, show prior art oscillators.
Figure 2:
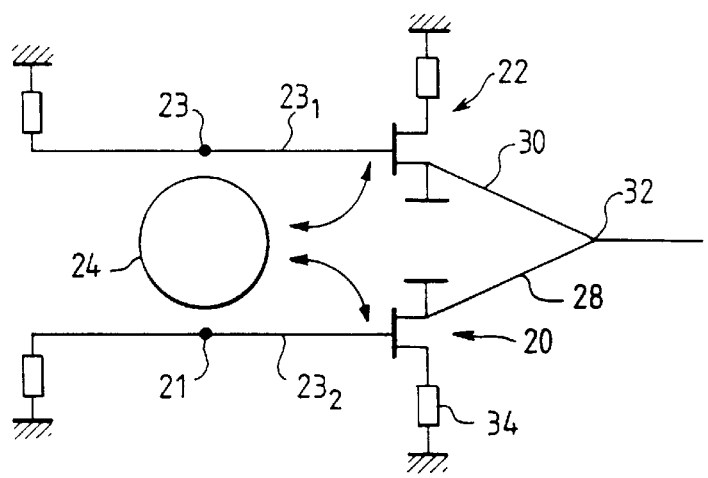

A line of length λ/4 (not shown) analogous to the line 18 from FIG. 1 is fitted at the ports 46 and 48 to obtain short circuits at those ports.

The distances of the ports 46 and 48 from the resonator are then adjusted to optimize the feedback.

After this operation the lines of length λ/4 are removed. Under these conditions oscillation is no longer obtained.

The active component 42 with the lines 52 and 56 is then installed. The signals from the two basic oscillators with active components 40 and 42 then automatically assume an antiphase relationship. The two oscillators are synchronized to 180°, i.e. practically form short circuits at the ports 46 and 48, independently of the characteristics of the resonator.

The oscillator operates at twice the resonant frequency of the resonator 44. It is highly stable and has low phase noise. It does not require manual adjustment. It can therefore easily be mass produced by automated plant. Also, as already mentioned, the associated circuits can have a relatively large bandwidth. Furthermore, it is not necessary to provide a combiner as in a standard "push-push" set-up.

The output signal of the oscillator is obtained with the aid of an antenna (not shown) coupled to the housing containing the components 40, 42 and 44, for example.

It can operate throughout the microwave range, i.e. from 500 MHz to 60 GHz. It gives particularly good results in the Ku band from 10 GHz to 15 GHz. It is useful in particular in the field of telecommunications and/or digital television signal transmission.

Figure 4:
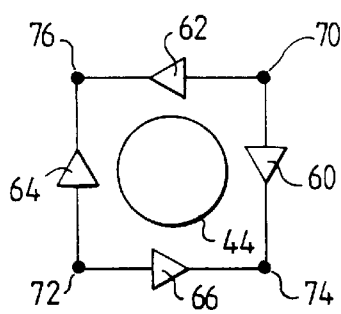
FIG. 4 is a block diagram of another embodiment of an oscillator according to the invention, which has four active components.

In the embodiment shown in FIG. 4 the oscillator includes a resonator 44 associated with four basic oscillators, i.e. four active components, 60, 62, 64 and 66. The active components are amplifiers which are arranged so that the input of one amplifier is connected to the input of a neighboring amplifier via a corresponding port 70, 72 and the output of each amplifier is connected to the output of another neighboring amplifier via respective ports 74 and 76.

Thus the port 70 is connected to the inputs of the amplifiers 60 and 62 and the port 72 is connected to the inputs of the amplifiers 64 and 66. The port 74 is connected to the outputs of the amplifiers 60 and 66 and the port 76 is connected to the outputs of the amplifiers 62 and 64.

As in the FIG. 3 set-up, positions of the ports are chosen so that the input and the output of each amplifier are practically in antiphase.

Moreover, each basic oscillator operates in antiphase with the neighboring basic oscillator, i.e. the ports 70, 72, 74, 76 practically constitute short circuits or virtual grounds. Thus, for example, the basic oscillator with the active element 60 produces oscillations in antiphase with the oscillations of the basic oscillator with the active component 62 and in antiphase with the oscillations of the basic oscillator with the active component 66.

As in the embodiment described with reference to FIG. 3, the oscillator with four active components oscillates at twice the frequency of the resonator. Note that in this embodiment two non-adjacent oscillators are in phase.

The advantage of the FIG. 4 set-up over that shown in FIG. 3 is that it delivers a higher power and its phase noise is even lower.

Generally speaking, the set-up can include an even number of active components.

There is claimed:

1. A microwave oscillator including at least two active components and a dielectric resonator and wherein the coupling between each active component and said dielectric resonator is of the transmission type and inputs of neighboring active components are connected to a first point coupled to said resonator and likewise outputs of said active components are connected to a second point coupled to said resonator.

2. The oscillator claimed in claim 1 wherein waves in said lines terminating at said first coupling point are in antiphase and likewise waves in said lines terminating at said second coupling point are in antiphase.

3. The oscillator claimed in claim 1 including active components which are practically identical and wherein the length of said lines connecting said first coupling point to said inputs of said active components are practically equal and the lengths of said lines connecting said second coupling point to said outputs of said active components are substantially equal.

4. The oscillator claimed in claim 1 including an even number of active components associated with a single resonator.

5. The oscillator claimed in claim 1 wherein said active components each include an amplifier.

6. The oscillator claimed in claim 1 wherein said resonator is circular and said coupling points are at diametrally opposite positions relative to said resonator.

7. The oscillator claimed in claim 1 wherein said dielectric resonator has a resonant frequency chosen so that said oscillator has a frequency in the band from 10 GHz to 15 GHz.

8. A method of producing an oscillator as claimed in claim 1 starting from an active component and a resonator, in which method a line of length $\lambda/4$ is connected to said first and second coupling points to provide short circuits, the distance of said coupling points from said resonator is adjusted to minimize feedback whilst maintaining the oscillation obtained with said active component, said lines of length $\lambda/4$ are removed and at least one other active component is installed at said coupling point(s).

* * * * *